(12) United States Patent
Matsuyama

(10) Patent No.: US 9,799,597 B2
(45) Date of Patent: Oct. 24, 2017

(54) SEMICONDUCTOR PACKAGE

(71) Applicant: Kabushiki Kaisha Toshiba, Minato-ku, Tokyo (JP)

(72) Inventor: Hiroshi Matsuyama, Nomi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/063,766

(22) Filed: Mar. 8, 2016

(65) Prior Publication Data

US 2017/0069569 A1    Mar. 9, 2017

(30) Foreign Application Priority Data

Sep. 4, 2015    (JP) .................................. 2015-174612

(51) Int. Cl.
*H01L 27/08*        (2006.01)
*H01L 23/498*       (2006.01)
(Continued)

(52) U.S. Cl.
CPC .... *H01L 23/49844* (2013.01); *H01L 23/3735* (2013.01); *H01L 23/49811* (2013.01); *H01L 25/072* (2013.01); *H01L 29/7397* (2013.01); *H01L 29/861* (2013.01); *H01L 23/3121* (2013.01); *H01L 2224/48091* (2013.01); *H01L 2224/48227* (2013.01); *H01L 2224/49113* (2013.01); *H01L 2224/73265* (2013.01); *H01L 2924/181* (2013.01)

(58) Field of Classification Search
CPC ........... H01L 23/5227; H01L 23/49844; H01L 29/7397; H01L 25/072; H01L 29/861
See application file for complete search history.

(56) References Cited

U.S. PATENT DOCUMENTS 5,459,356 A     10/1995  Schulze et al.
2012/0181682 A1*  7/2012  Soyano ................... H01L 23/04
                                                       257/692

(Continued)

FOREIGN PATENT DOCUMENTS

| JP | 05-235258 A    | 9/1993 |
| JP | 2007-110870 A  | 4/2007 |
| JP | 2010-027710 A  | 2/2010 |

*Primary Examiner* — Dale E Page
*Assistant Examiner* — Wasiul Haider
(74) *Attorney, Agent, or Firm* — White & Case LLP

(57) ABSTRACT

According to one embodiment, a semiconductor package includes a first substrate, first conductive layers, first semiconductor chips, a second conductive layer, a first terminal, and a second terminal. The first substrate has a first surface. The first conductive layers are provided on the first surface. Each of the first semiconductor chips includes a first electrode and a second electrode. Each of the first conductive layers is connected to at least one of the first electrodes. The second conductive layer is provided on the first surface to be separated from the first conductive layers. The second conductive layer is connected to a plurality of the second electrodes. The first terminal is connected to the first conductive layers. Inductances between the first extension unit and each of the first conductive layers are substantially equal to each other. The second terminal is connected to the second conductive layer.

13 Claims, 10 Drawing Sheets

(51) Int. Cl.
*H01L 29/739* (2006.01)
*H01L 29/861* (2006.01)
*H01L 25/07* (2006.01)
*H01L 23/373* (2006.01)
*H01L 23/31* (2006.01)

(56) References Cited

U.S. PATENT DOCUMENTS

2014/0061673 A1* 3/2014 Miyanagi ............... H01L 24/73
 257/77
2014/0346659 A1* 11/2014 Nakamura ........... H05K 7/1432
 257/704

* cited by examiner

SEMICONDUCTOR PACKAGE

CROSS-REFERENCE TO RELATED APPLICATIONS

This application is based upon and claims the benefit of priority from Japanese Patent Application No. 2015-174612, filed on Sep. 4, 2015; the entire contents of which are incorporated herein by reference.

FIELD

Embodiments described herein relate generally to a semiconductor package.

BACKGROUND

A semiconductor package includes multiple conductive layers provided on a substrate, and terminals connected to the multiple conductive layers. In the semiconductor package, currents flow in semiconductor chips connected to each of the conductive layers via the terminals and the conductive layers. When transitioning between ON and OFF, etc., there is a possibility that breakdown of the semiconductor chips may undesirably occur if there is an imbalance between the currents flowing in the semiconductor chips.

DETAILED DESCRIPTION

Figure 1:
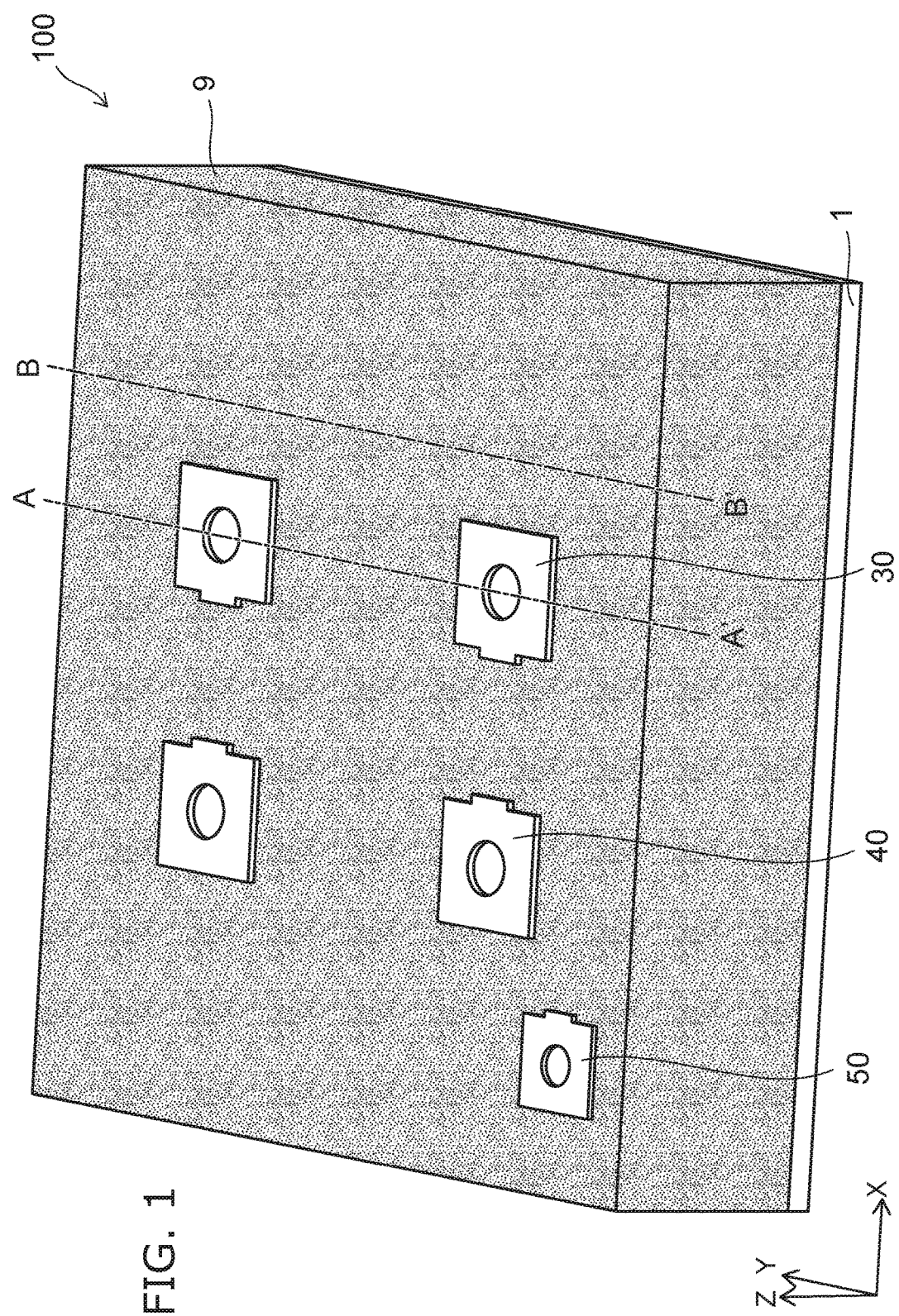
FIG. 1 to FIG. 3 are perspective views of a semiconductor package according to an embodiment.

According to one embodiment, a semiconductor package includes a first substrate, a plurality of first conductive layers, a plurality of first semiconductor chips, a second conductive layer, a first terminal, and a second terminal. The first substrate has a first surface. The first conductive layers are provided on the first surface. Each of the first semiconductor chips includes a first electrode and a second electrode. Each of the first conductive layers is connected to at least one of the first electrodes. The first conductive layers are connected to mutually-different first electrodes. The second conductive layer is provided on the first surface to be separated from the plurality of first conductive layers. The second conductive layer is connected to a plurality of the second electrodes. The first terminal includes a first extension unit. The first extension unit extends in a first direction perpendicular to the first surface. The first terminal is connected to the plurality of first conductive layers. Inductances between the first extension unit and each of the first conductive layers are substantially equal to each other. The second terminal is connected to the second conductive layer.

Various embodiments will be described hereinafter with reference to the accompanying drawings.

The drawings are schematic and conceptual, and the relationships between the thickness and width of portions, the size ratio among portions, etc., are not necessarily the same as the actual values thereof. Further, the dimensions and proportions may be illustrated differently among drawings, even for identical portions.

The drawings are schematic or conceptual. The relationship between the thickness and the width of each portion, and the size ratio between the portions are not necessarily identical to those in reality. Furthermore, the same portion may be shown with different dimensions or ratios in different figures.

In the present specification and drawings, the same elements as those described previously with reference to earlier figures are labeled with like reference numerals, and the detailed description thereof is omitted as appropriate.

An XYZ-orthogonal coordinate system is used for the description of the respective embodiments. A direction perpendicular to a first surface S1 is taken as a Z-direction (first direction), and two directions perpendicular to each other and perpendicular to the Z-direction are taken as an X-direction (second direction) and a Y-direction (third direction).

An example of a semiconductor package according to an embodiment will now be described using FIG. 1 to FIG. 6B.

Figure 2:
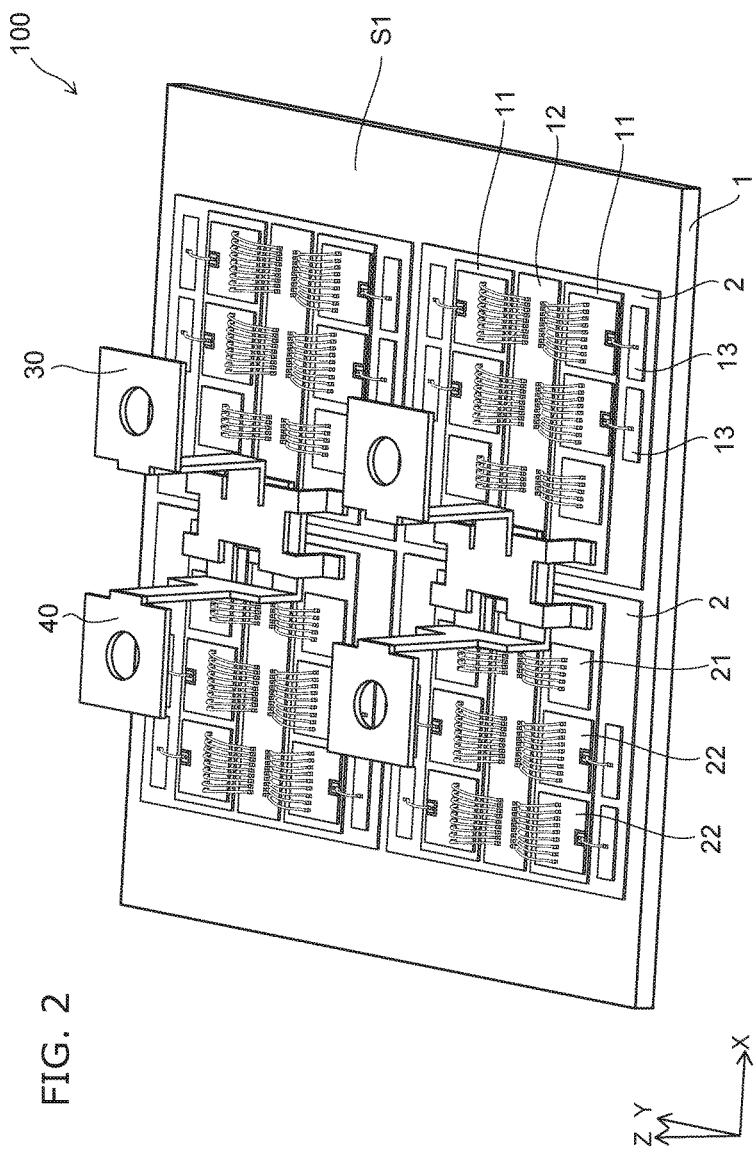
Figure 3:
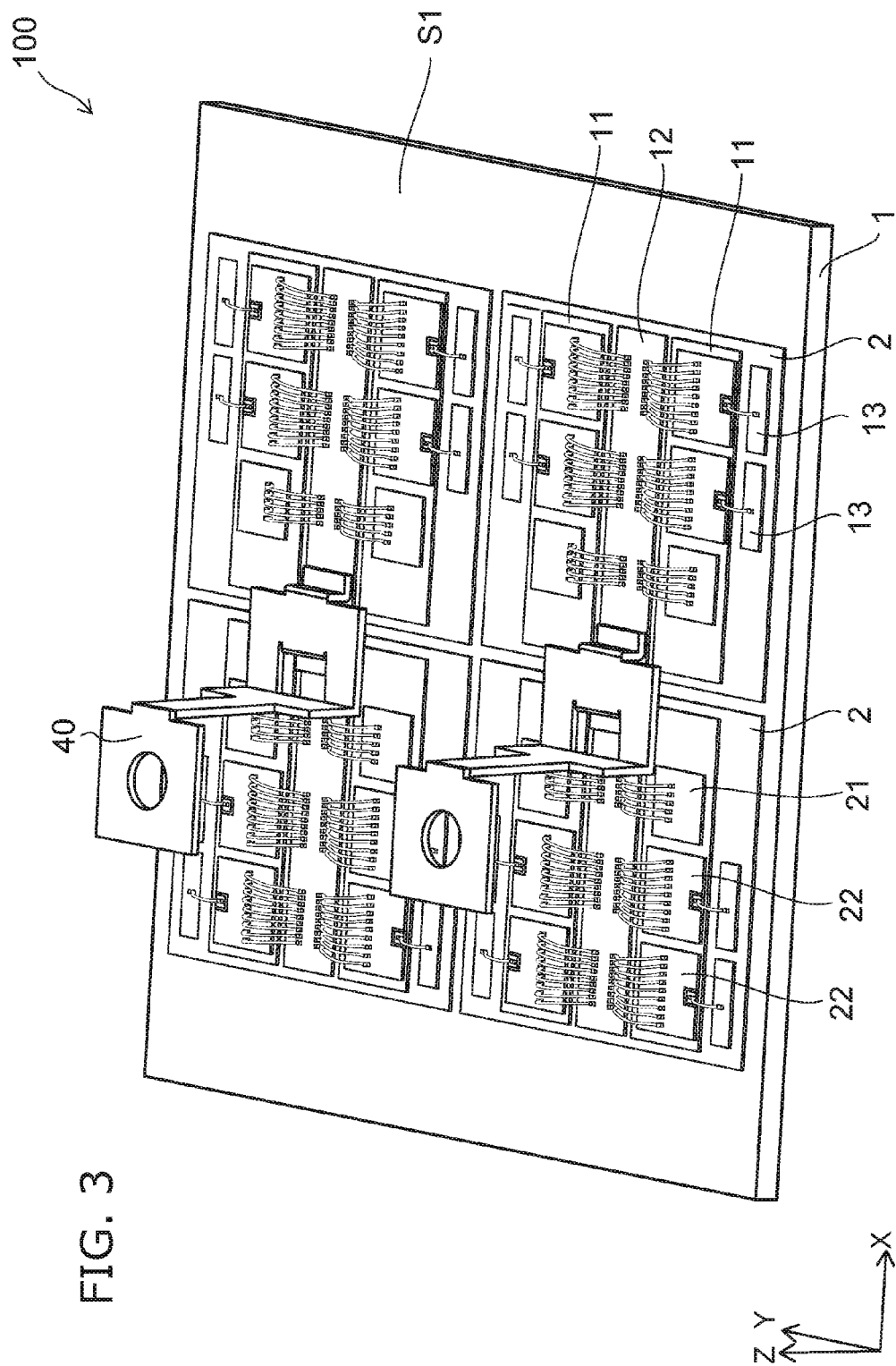

FIG. 1 to FIG. 3 are perspective views of the semiconductor package 100 according to the embodiment.

Figure 4A:
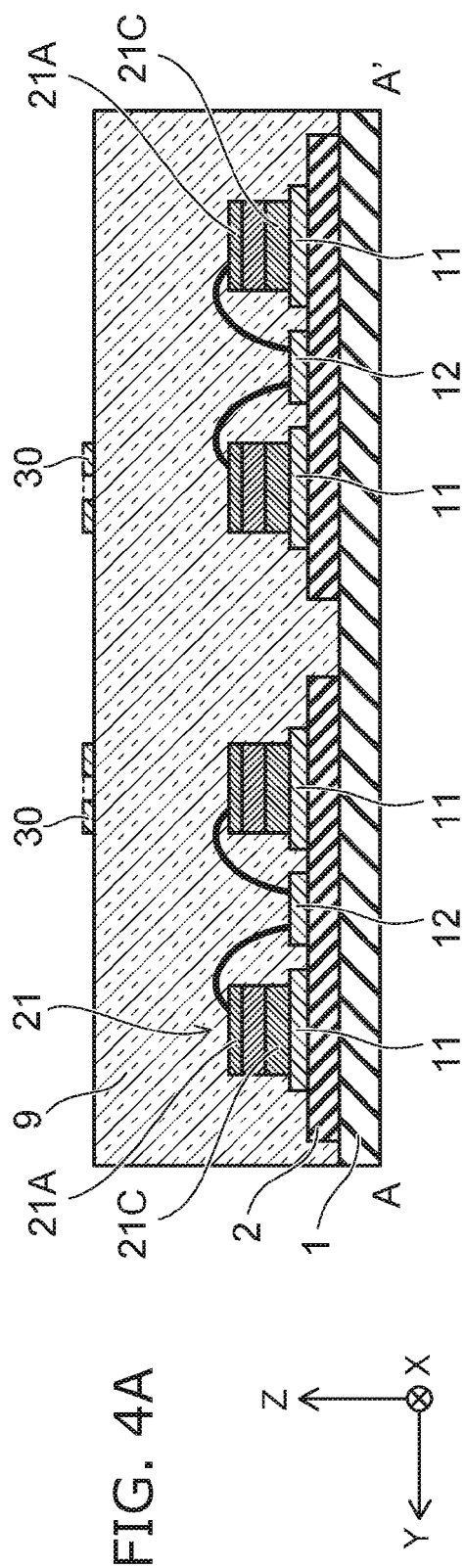
FIGS. 4A and 4B are cross-sectional views of the semiconductor package according to the embodiment.
Figure 4B:
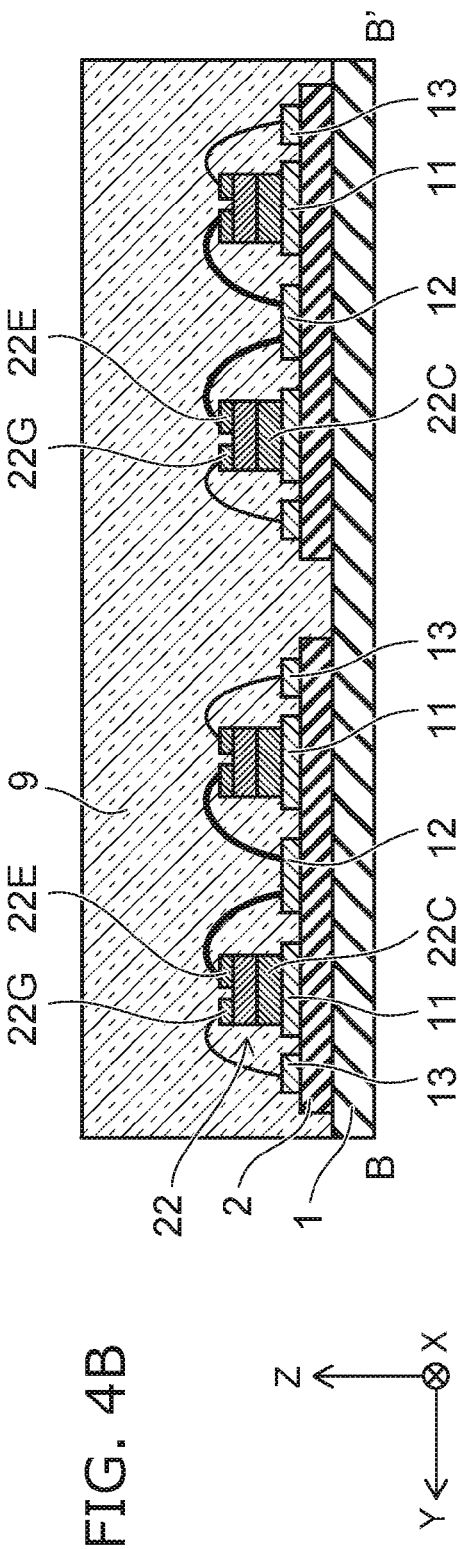

FIG. 4A is a cross-sectional view including line A-A' of FIG. 1; and FIG. 4B is a cross-sectional view including line B-B' of FIG. 1.

Figure 5A:
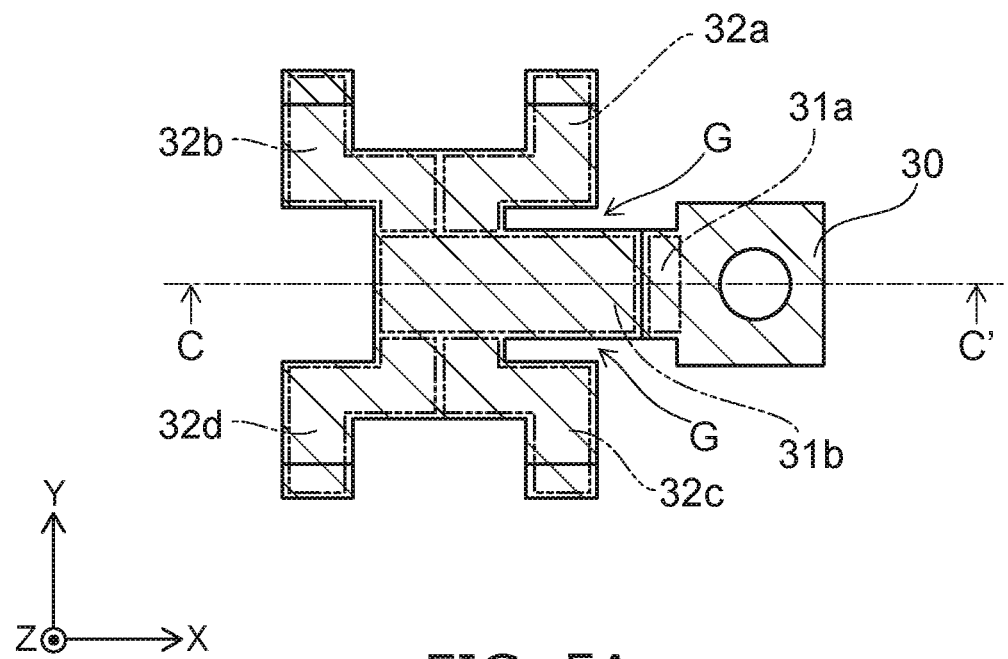
FIGS. 5A and 5B are a plan view and a cross-sectional view of a first terminal.
Figure 5B:
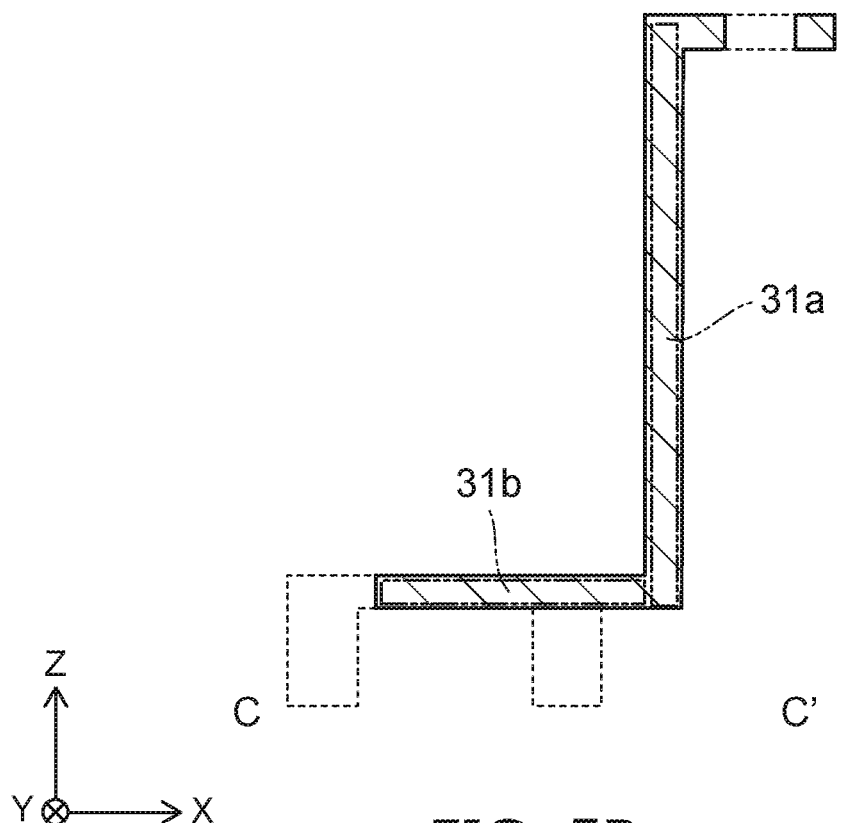

FIG. 5A is a plan view of a first terminal 30; and FIG. 5B is a C-C' cross-sectional view of FIG. 5A.

Figure 6A:
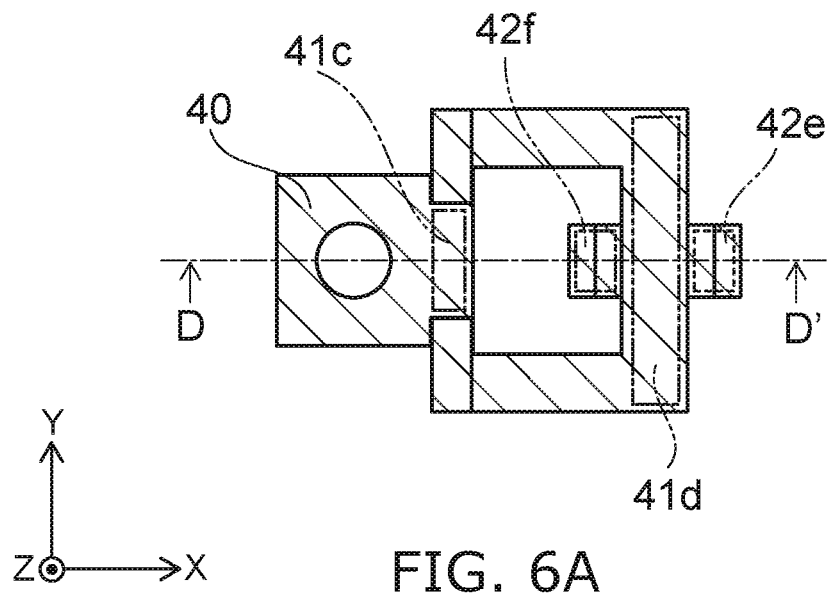
FIGS. 6A and 6B are a plan view and a cross-sectional view of a second terminal.
Figure 6B:
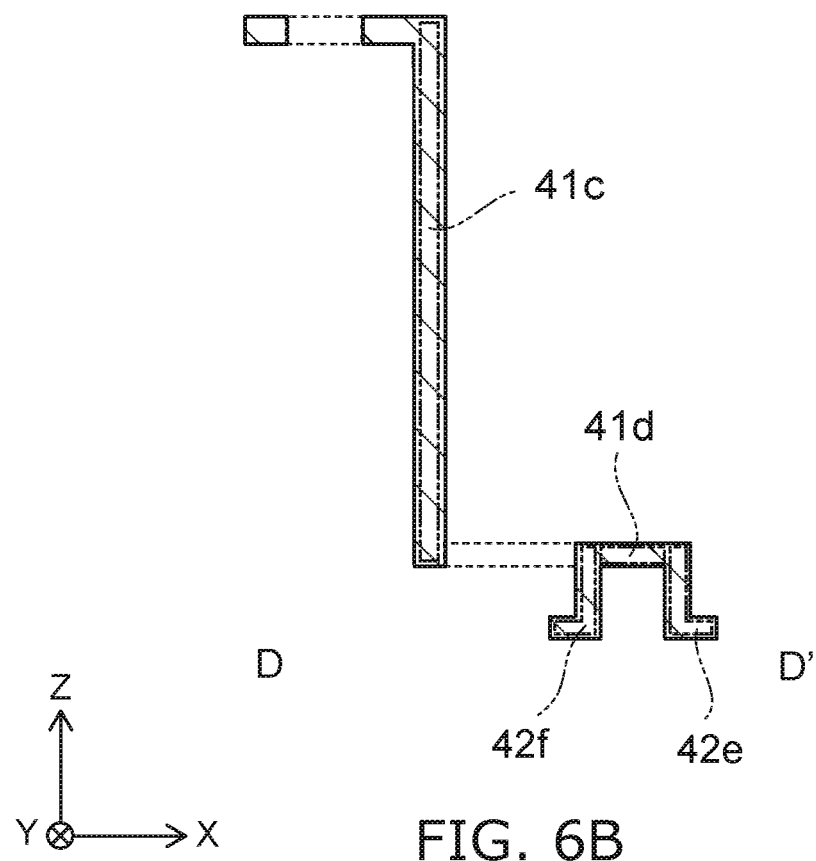

FIG. 6A is a plan view of a second terminal 40; and FIG. 6B is a D-D' cross-sectional view of FIG. 6A.

A sealing unit 9 and a third terminal 50 are omitted in FIG. 2. The sealing unit 9, the first terminal 30, and the third terminal 50 are omitted in FIG. 3.

As shown in FIG. 1 and FIG. 2, the semiconductor package 100 includes a first substrate 1, a second substrate 2, the sealing unit 9, a first conductive layer 11, a second conductive layer 12, a third conductive layer 13, a first semiconductor chip 21, a second semiconductor chip 22, the first terminal 30, the second terminal 40, and the third terminal 50.

The first semiconductor chip 21 is, for example, a diode. The second semiconductor chip 22 is, for example, an IGBT. The first semiconductor chip 21 is connected in anti-parallel with the second semiconductor chip 22 and functions as, for example, a FWD (Free Wheeling Diode).

As shown in FIG. 1, the sealing unit 9 is provided on the first substrate 1 and seals the other components on the first substrate 1. A portion of the first terminal 30, a portion of the second terminal 40, and a portion of the third terminal 50 are provided on the sealing unit 9 and are exposed to the outside. A hole is made in each of the terminals. Not-shown fasteners are provided respectively at the positions corresponding to the holes at the upper surface of the sealing unit 9.

The first substrate 1 has a first surface S1 as shown in FIG. 2. The multiple second substrates 2 are provided to be separated from each other on the first surface S1.

The multiple first conductive layers 11, the second conductive layer 12, and the multiple third conductive layers 13 are provided to be separated from each other on each of the second substrates 2. These conductive layers may be provided on the first substrate 1 directly without the second substrates 2 being interposed.

The first semiconductor chip 21 and the multiple second semiconductor chips 22 are provided on the first conductive layer 11. However, the number of first semiconductor chips 21 and the number of second semiconductor chips 22 provided on the first conductive layer 11 are arbitrary.

As shown in FIG. 4A, the first semiconductor chip 21 includes a cathode electrode 21C (a first electrode) and an anode electrode 21A (a second electrode).

As shown in FIG. 4B, the second semiconductor chip 22 includes a collector electrode 22C (a third electrode), an emitter electrode 22E (a fourth electrode), and a gate electrode 22G (a fifth electrode).

The cathode electrode 21C and the collector electrode 22C are connected to the first conductive layer 11 by solder.

The anode electrode 21A and the emitter electrode 22E are connected to the second conductive layer 12 by bonding wires. In the example shown in FIG. 2 and FIG. 3, the multiple anode electrodes 21A and the multiple emitter electrodes 22E are connected to one second conductive layer 12.

The gate electrode 22G is connected to the third conductive layer 13 by a bonding wire.

As shown in FIG. 2, the first terminal 30 is connected to the multiple first conductive layers 11.

As shown in FIG. 3, the second terminal 40 is connected to the multiple second conductive layers 12. A portion of the second terminal 40 is positioned between the first terminal 30 and the first substrate 1 in the Z-direction.

The third terminal 50 is connected to the third conductive layers 13 via a not-shown printed circuit board, etc.

As shown in FIGS. 5A and 5B, the first terminal 30 includes a first extension unit 31a, a second extension unit 31b, a first connection unit 32a, a second connection unit 32b, a third connection unit 32c, and a fourth connection unit 32d.

The first extension unit 31a extends in the Z-direction. The second extension unit 31b extends in the X-direction; and one end of the first extension unit 31a contacts one end of the second extension unit 31b. The second extension unit 31b is connected between the first extension unit 31a and the multiple first conductive layers 11.

One of the first to fourth connection units 32a to 32d is connected between the second extension unit 31b and each of the first conductive layers 11. Specifically, one end of each of the first to fourth connection units 32a to 32d respectively contacts the first conductive layers 11; and the other end of each of the first to fourth connection units 32a to 32d contacts the second extension unit 31b.

The first connection unit 32a and the second connection unit 32b are arranged in the X-direction. The third connection unit 32c and the fourth connection unit 32d are arranged in the X-direction. The first connection unit 32a and the third connection unit 32c are arranged in the Y-direction. The second connection unit 32b and the fourth connection unit 32d are arranged in the Y-direction.

The position in the X-direction of the first connection unit 32a is between the position in the X-direction of the first extension unit 31a and the position in the X-direction of the second connection unit 32b. A gap G is provided between a portion of the first connection unit 32a and a portion of the second extension unit 31b and between a portion of the third connection unit 32c and a portion of the second extension unit 31b.

As shown in FIGS. 6A and 6B, the second terminal 40 includes a third extension unit 41c, a fourth extension unit 41d, a fifth connection unit 42e, and a sixth connection unit 42f.

The third extension unit 41c extends in the Z-direction.

The fourth extension unit 41d extends in the Y-direction and is connected between the third extension unit 41c and the multiple second conductive layers 12.

The fifth connection unit 42e and the sixth connection unit 42f are connected respectively between the fourth extension unit 41d and the second conductive layers 12. Specifically, one end of the fifth connection unit 42e and one end of the sixth connection unit 42f respectively contact the second conductive layers 12; and the other end of the fifth connection unit 42e and the other end of the sixth connection unit 42f contact the fourth extension unit 41d.

The fifth connection unit 42e and the sixth connection unit 42f are arranged in the X-direction.

The position in the X-direction of the fourth extension unit 41d is between the position in the X-direction of the fifth connection unit 42e and the position in the X-direction of the sixth connection unit 42f.

Examples of the materials of the components will now be described.

The first substrate 1 is a heat dissipation plate formed of a metal material or a conductive composite material including a ceramic material and a metal material. Or the first substrate 1 may be formed of an insulating material. In the case where the first substrate is formed of the ceramic material, the first substrate 1 can be more insulative. In the case where the first conductive layer 11, the second conductive layer 12, and third conductive layer 13 are provided directly on the first substrate 1, the first substrate 1 is favorable to be formed of the ceramic material and insulative.

The second substrate 2 includes an insulating material such as AlN, etc.

The sealing unit 9 includes an insulating resin such as a silicone resin, etc.

The first conductive layer 11, the second conductive layer 12, and the third conductive layer 13 include a metal material such as copper, etc.

The first semiconductor chip 21 and the second semiconductor chip 22 include semiconductor elements having silicon, silicon carbide, gallium nitride, or gallium arsenide as a major component.

The first terminal 30, the second terminal 40, and the third terminal 50 include a metal material such as copper, etc.

Operations and effects according to the embodiment will now be described.

In the semiconductor package 100 according to the embodiment, the first terminal 30 includes the first extension unit 31a and the first to fourth connection units 32a to 32d; and the gap G is provided between the first connection unit 32a and the second extension unit 31b and between the third connection unit 32c and the second extension unit 31b.

By employing such a configuration, the inductances between the first extension unit 31a and each of the first conductive layers 11 can be set to be equal.

In the case where the difference between one of the inductances and one other of the inductances is within 10% of at least the one of the inductances, these inductances can be considered to be substantially equal.

By setting the inductances between the first extension unit 31a and each of the first conductive layers 11 to be equal, it is possible to suppress the imbalance between the currents flowing in each of the first conductive layers 11 when transitioning in turn-on, turn-off, etc. As a result, it is possible to suppress damage of the semiconductor chips, the bonding wires, etc., due to a biased current flowing in one first conductive layer 11.

In the semiconductor package 100 according to the embodiment, the current path that includes the first conductive layer 11, the second semiconductor chip 22, and the second conductive layer 12 is multiply provided between the first terminal 30 and the second terminal 40; and the current paths are connected in parallel with each other.

In such a configuration, the inductances between the fourth extension unit 41*d* and each of the second conductive layers 12 can be set to be equal by the second terminal 40 including the fourth extension unit 41*d*, the fifth connection unit 42*e*, and the sixth connection unit 42*f*.

The inductances of the current paths can be set to be equal by setting the inductances between the first terminal 30 and each of the first conductive layers 11 to be equal and by setting the inductances between the second terminal 40 and each of the second conductive layers 12 to be equal. By setting the inductances of the current paths to be equal, it is possible to suppress the oscillation of the current when switching the second semiconductor chip 22.

Also, noise is generated in the voltage between the gate and the emitter of the second semiconductor chip 22 when switching the second semiconductor chip 22. The noise is amplified if the frequency component of the noise matches the resonant frequency of one of the multiple resonance loops included in the semiconductor package 100. If the noise is amplified, there is a possibility that the second semiconductor chip 22 may be switched to the ON state regardless of whether or not the application of the voltage to the gate electrode is OFF.

According to the embodiment, the resonant frequencies of the current paths can be set to be equal by setting the inductances of the current paths to be equal. Therefore, the likelihood of the operation frequency of the second semiconductor chip 22 matching the resonant frequencies of the resonance loops can be reduced; and the likelihood of the second semiconductor chip 22 being unintentionally switched to the ON state can be reduced.

(First Modification)

Figure 7A:
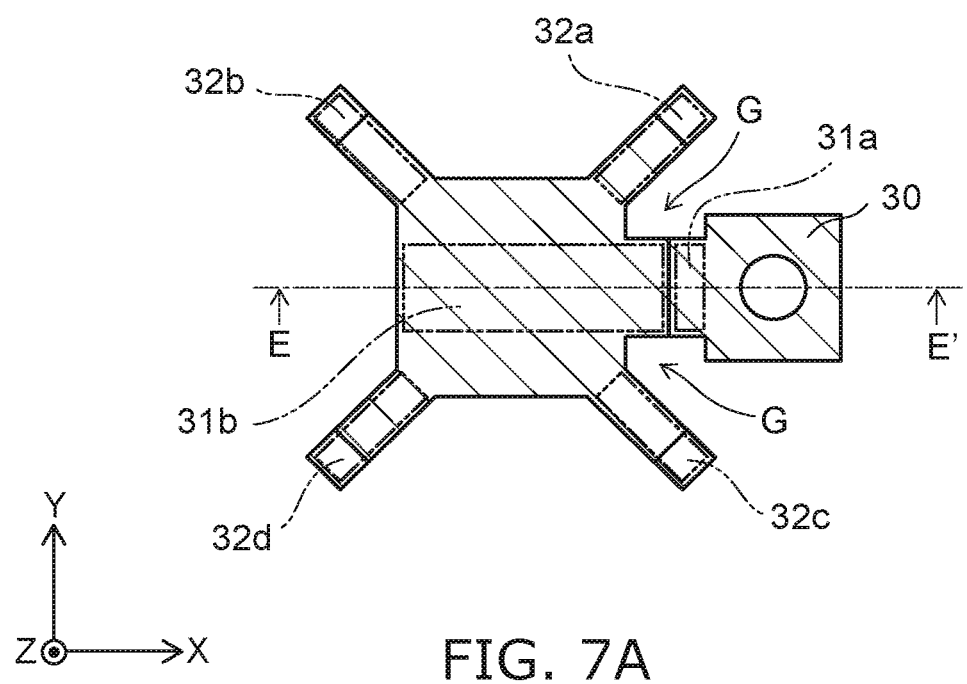
FIGS. 7A and 7B are a plan view and a cross-sectional view showing another example of the first terminal.
Figure 7B:
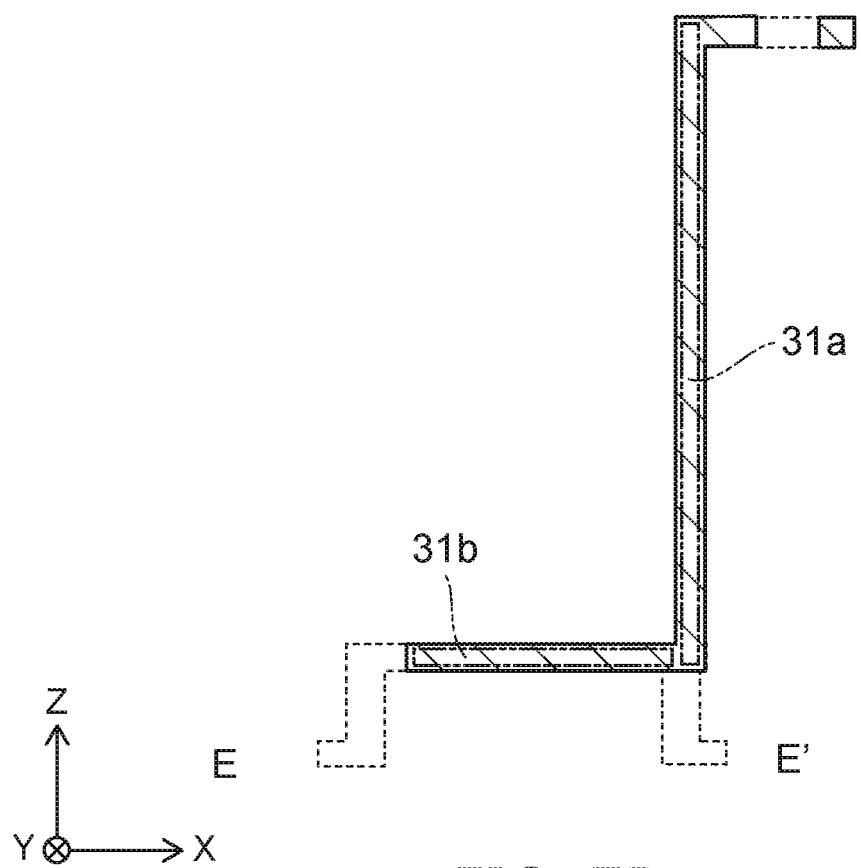

Instead of the structure shown in FIGS. 5A and 5B, the first terminal 30 may have the structure shown in FIGS. 7A and 7B.

FIGS. 7A and 7B are a plan view and a cross-sectional view showing another example of the first terminal 30. FIG. 7A is a plan view; and FIG. 7B is a cross-sectional view along line E-E' of FIG. 7A.

In the structure shown in FIG. 7A, a portion of the first connection unit 32*a* extends toward the fourth connection unit 32*d*. A portion of the second connection unit 32*b* extends toward the third connection unit 32*c*. A portion of the third connection unit 32*c* extends toward the second connection unit 32*b*. A portion of the fourth connection unit 32*d* extends toward the first connection unit 32*a*.

In other words, the first to fourth connection units 32*a* to 32*d* extend in a radial configuration from portions of the second extension unit 31*b* toward each of the first conductive layers 11.

Even in the case where the structure shown in FIGS. 7A and 7B is used, the inductances between the first extension unit 31*a* and each of the first conductive layers 11 can be set to be equal.

In the semiconductor package according to the modification, the gap G is provided between the second extension unit 31*b* and the first connection unit 32*a*; and each of the connection units extend from the second extension unit 31*b* in a radial configuration. By employing such a configuration, compared to the form shown in FIGS. 5A and 5B, the length of the current path between the first connection unit 32*a* and the second connection unit 32*b* can be set to be equal to the length of the current path between the first connection unit 32*a* and the third connection unit 32*c*. By setting the current paths to be equal, the resonant frequency of the resonance loop including the first connection unit 32*a* and the second connection unit 32*b* can be set to be equal to the resonant frequency of the resonance loop including the first connection unit 32*a* and the third connection unit 32*c*. As a result, it is possible to reduce even further the likelihood of the operation frequency of the second semiconductor chip 22 matching the resonant frequencies of the resonance loops.

(Second Modification)

Figure 8A:
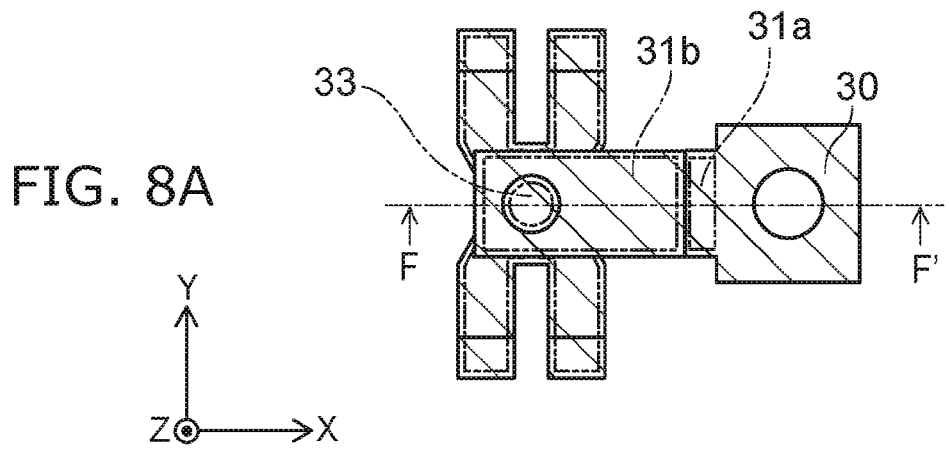
FIGS. 8A to 8C are plan views and a cross-sectional view showing another example of the first terminal.
Figure 8B:
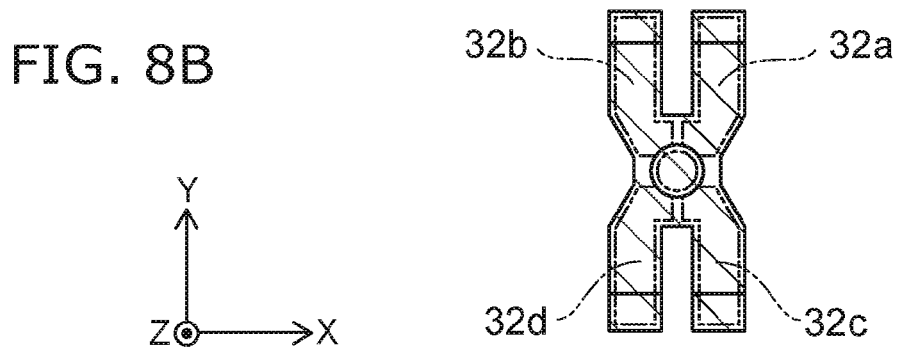
Figure 8C:
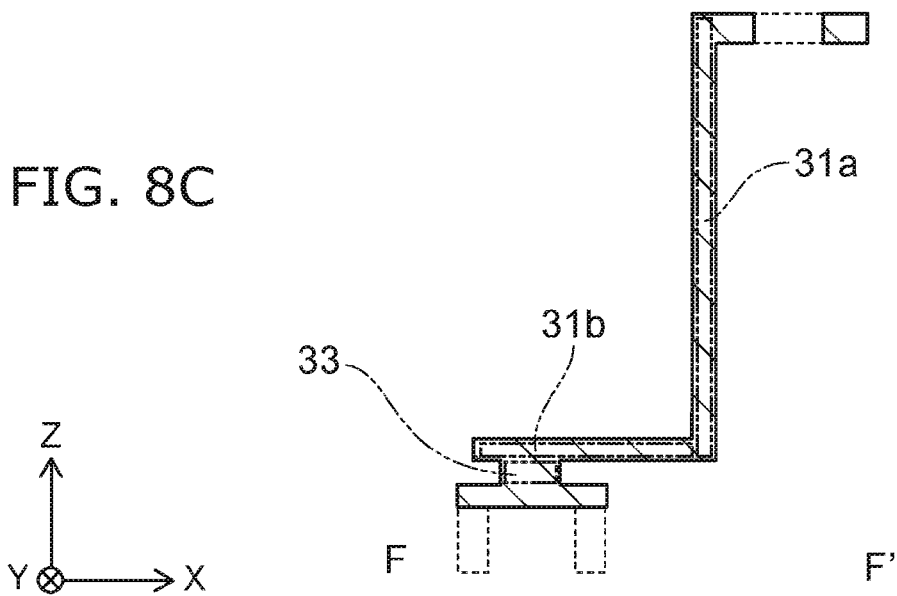

Instead of the structure shown in FIGS. 5A and 5B, the first terminal 30 may have the structure shown in FIGS. 8A to 8C.

FIGS. 8A to 8C are plan views and a cross-sectional view showing another example of the first terminal 30. Specifically, FIG. 8A is a plan view; FIG. 8B is a plan view; and FIG. 8C is a cross-sectional view along line F-F' of FIG. 8A.

In FIG. 8B, the components other than a middle unit 33 and the first to fourth connection units 32*a* to 32*d* are omitted.

In the structure shown in FIG. 8A, the first terminal 30 further includes the middle unit 33. The middle unit 33 is provided between the second extension unit 31*b* and the first to fourth connection units 32*a* to 32*d* in the Z-direction. The length in the X-direction of the middle unit 33 is shorter than the length in the X-direction of the second extension unit 31*b*; and the length in the Y-direction of the middle unit 33 is shorter than the length in the Y-direction of the second extension unit 31*b*. One end of each of the first to fourth connection units 32*a* to 32*d* contacts the middle unit 33; and these connection units extend in a radial configuration from the middle unit 33 toward each of the first conductive layers 11.

By using the first terminal 30 shown in FIGS. 8A to 8C as well, it is possible to set the inductances between the first extension unit 31*a* and each of the first conductive layers 11 to be equal.

By providing the middle unit 33, it is easy to set the inductances between the second extension unit 31*b* and each of the first conductive layers 11 to be equal regardless of the configurations of the first extension unit 31*a* and the second extension unit 31*b*.

(Third Modification)

Figure 9A:
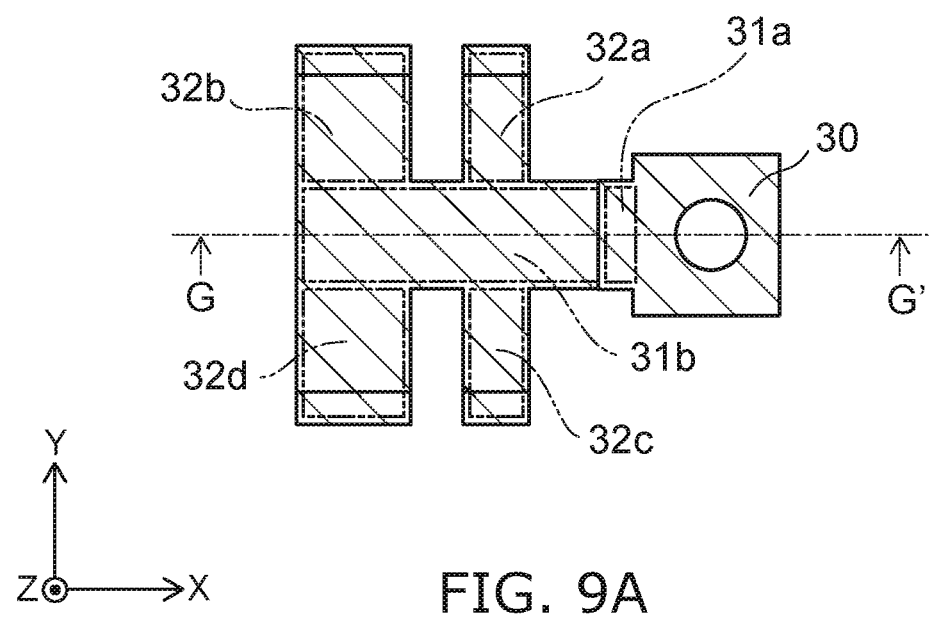
FIGS. 9A and 9B are a plan view and a cross-sectional view showing another example of the first terminal.
Figure 9B:
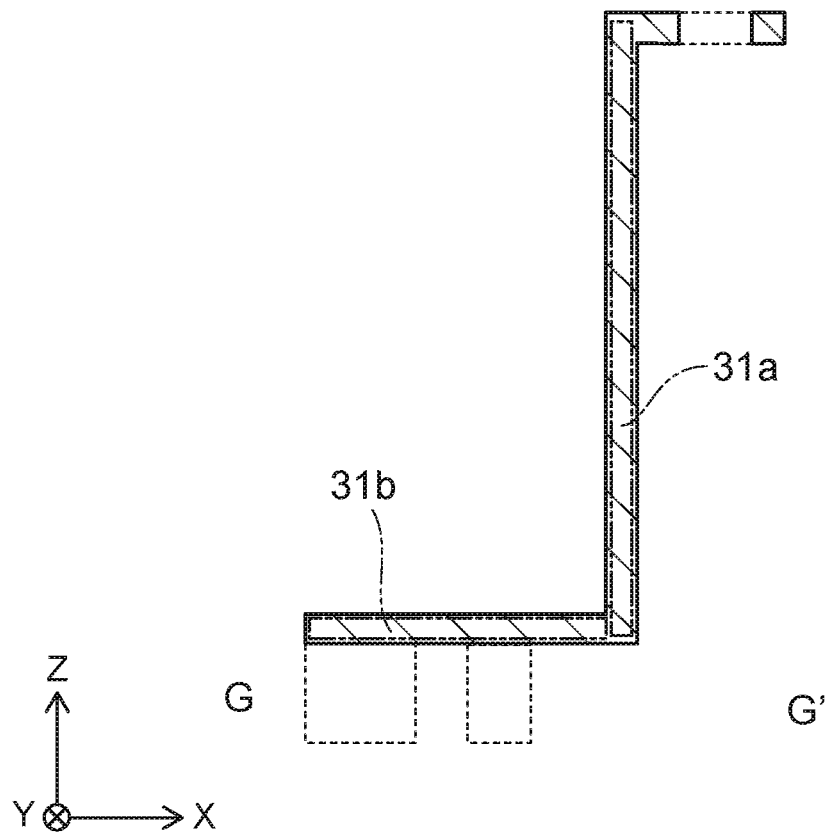

Instead of the structure shown in FIGS. 5A and 5B, the first terminal 30 may have the structure shown in FIGS. 9A and 9B.

FIGS. 9A and 9B are a plan view and a cross-sectional view showing another example of the first terminal 30.

Specifically, FIG. 9A is a plan view; and FIG. 9B is a cross-sectional view along line G-G' of FIG. 9A.

The first to fourth connection units 32*a* to 32*d* extend in the Y-direction in the structure shown in FIG. 9A. The width of the first connection unit 32*a* and the width of the third connection unit 32*c* are narrower than the width of the second connection unit 32*b* and the width of the fourth connection unit 32*d*. Here, the width means the length in a direction perpendicular to the direction in which each of the connection units extends, i.e., the X-direction in the example shown in FIGS. 9A and 9B.

In the case where the width of the first connection unit 32*a* is narrower than the width of the second connection unit 32b, the inductance of the first connection unit 32a is larger than the inductance of the second connection unit 32b. In other words, the connection units that are provided proximally to the first extension unit 31a have larger inductances.

On the other hand, the current path between the first extension unit 31a and the second connection unit 32b is longer than the current path between the first extension unit 31a and the first connection unit 32a. Therefore, the inductance between the first extension unit 31a and the second connection unit 32b is larger than the inductance between the first extension unit 31a and the first connection unit 32a.

Although the relationship between the first connection unit 32a and the second connection unit 32b is described in detail herein, this is similar for the relationship between the first connection unit 32a and the fourth connection unit 32d, the relationship between the third connection unit 32c and the second connection unit 32b, and the relationship between the third connection unit 32c and the fourth connection unit 32d as well.

As described above, in the structure shown in FIGS. 9A and 9B, the width of each of the connection units is different according to the length of the current path between the first extension unit 31a and each of the connection units. As a result, it is possible to set the inductances between the first extension unit 31a and each of the first conductive layers 11 to be equal.

(Fourth Modification)

Figure 10A:
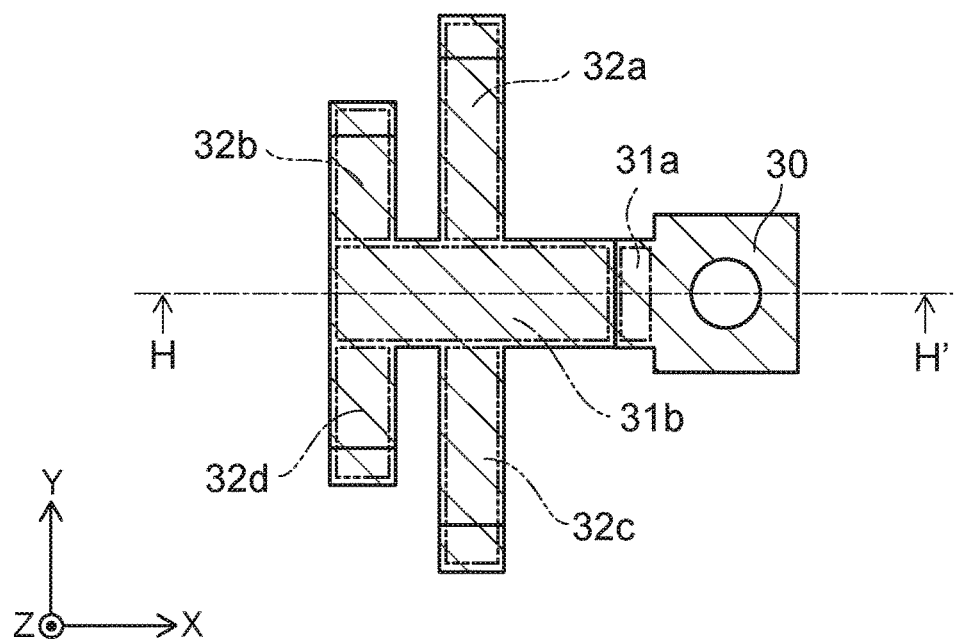
FIGS. 10A and 10B are a plan view and a cross-sectional view showing another example of the first terminal.
Figure 10B:
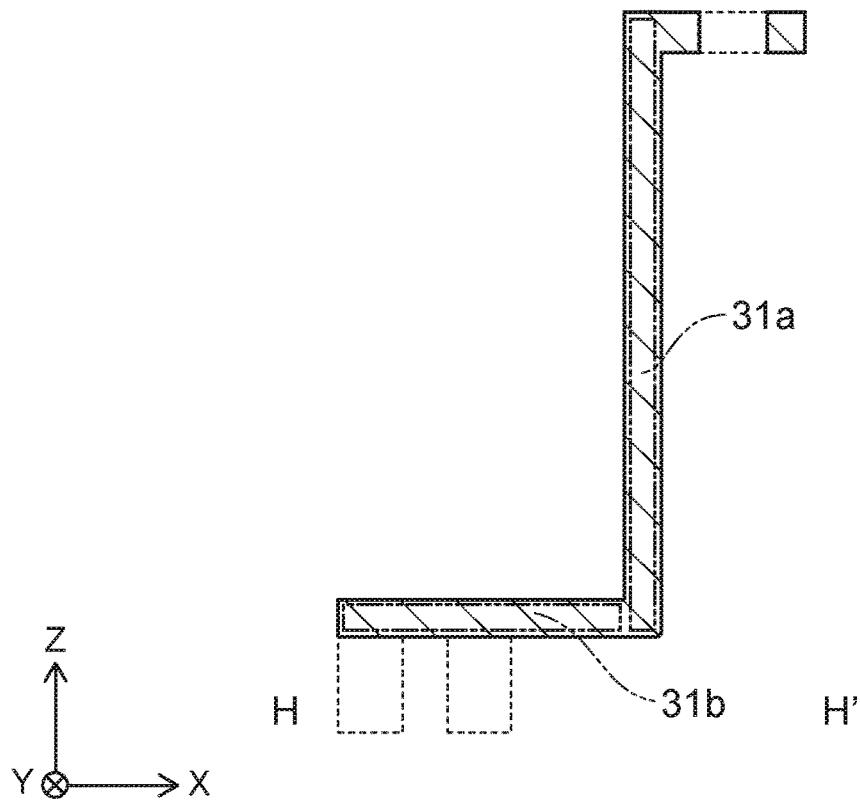

Instead of the structure shown in FIGS. 5A and 5B, the first terminal 30 may have the structure shown in FIGS. 10A and 10B.

FIGS. 10A and 10B are a plan view and a cross-sectional view showing another example of the first terminal 30. Specifically, FIG. 10A is a plan view; and FIG. 10B is a cross-sectional view along line H-H' of FIG. 10A.

The first to fourth connection units 32a to 32d extend in the Y-direction in the structure shown in FIG. 10A. The length of the first connection unit 32a and the length of the third connection unit 32c are longer than the length of the second connection unit 32b and the length of the fourth connection unit 32d. Here, the length means the length in the direction in which each of the connection units extends, i.e., the Y-direction in the example shown in FIGS. 10A and 10B.

In the case where the length of the first connection unit 32a is longer than the length of the second connection unit 32b, the inductance of the first connection unit 32a is larger than the inductance of the second connection unit 32b. In other words, the connection units that are provided proximally to the first extension unit 31a have larger inductances.

On the other hand, the current path between the first extension unit 31a and the second connection unit 32b is longer than the current path between the first extension unit 31a and the first connection unit 32a. Therefore, the inductance between the first extension unit 31a and the second connection unit 32b is larger than the inductance between the first extension unit 31a and the first connection unit 32a.

Although the relationship between the first connection unit 32a and the second connection unit 32b is described in detail herein, this is similar for the relationship between the first connection unit 32a and the fourth connection unit 32d, the relationship between the third connection unit 32c and the second connection unit 32b, and the relationship between the third connection unit 32c and the fourth connection unit 32d as well.

As described above, in the structure shown in FIGS. 10A and 10B, the length of each of the connection units is different according to the length of the current path between the first extension unit 31a and each of the connection units. As a result, it is possible to set the inductances between the first extension unit 31a and each of the first conductive layers 11 to be equal.

The semiconductor package according to the embodiments described above is not limited to the examples shown in the drawings; and various modifications are possible.

For example, more second substrates 2 may be provided on the first substrate 1. The semiconductor package 100 may include only one of the first semiconductor chip 21 or the second semiconductor chip 22. The first semiconductor chip 21 and the second semiconductor chip 22 may be other semiconductor chips such as MOSFETs, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. One skilled in the art can appropriately select specific configurations of components included in the embodiments, for example, the first substrate 1, the second substrate 2, the sealing unit 9, the first conductive layer 11, the second conductive layer 12, the third conductive layer 13, the first semiconductor chip 21, the second semiconductor chip 22, the third terminal 50 etc., from known art. The accompanying claims and their equivalents are intended to cover such forms or modifications as would fall within the scope and spirit of the invention.

What is claimed is:

1. A semiconductor package, comprising:
   a first substrate having a first surface;
   a plurality of first conductive layers provided on the first surface;
   a plurality of first semiconductor chips, each of the plurality of first semiconductor chips including a first electrode and a second electrode, each of the plurality of first conductive layers being connected to at least one of the first electrodes;
   a second conductive layer provided on the first surface to be separated from the plurality of first conductive layers, the second conductive layer being connected to a plurality of the second electrodes;
   a first terminal including
      a second extension unit extending in a second direction along the first surface, and
      a first connection unit, a second connection unit, a third connection unit, and a fourth connection unit connected between the second extension unit and each of the plurality of first conductive layers,
      the first connection unit and the second connection unit being arranged in the second direction,
      the third connection unit and the fourth connection unit being arranged in the second direction,
      the first connection unit and the third connection unit being arranged in a third direction perpendicular to the second direction along the first surface,
      a portion of the second extension unit being arranged in the third direction with a portion of the first connection unit and a portion of the third connection unit,
      a gap being provided between the portion of the second extension unit and the portion of the first connection unit and between the portion of the second extension unit and the portion of the third connection unit; and
   a second terminal connected to the second conductive layer.

2. The package according to claim 1, wherein
inductances between the second extension unit and each of the first conductive layers are substantially equal to each other.

3. The package according to claim 1, wherein the first conductive layers are respectively connected to mutually-different pluralities of the first electrodes.

4. The package according to claim 1, wherein
the second conductive layer is multiply provided on the first surface,
each of the second conductive layers is connected to at least one of the second electrodes, the second conductive layers being connected to mutually-different second electrodes, and
the second terminal is connected to the plurality of second conductive layers.

5. The package according to claim 4, wherein
the second terminal includes a third extension unit extending in a first direction perpendicular to the first surface, and
inductances between the third extension unit and each of the second conductive layers are substantially equal.

6. The package according to claim 1, wherein at least one of the first semiconductor chips is provided on each of the plurality of first conductive layers.

7. The package according to claim 6, wherein a plurality of the first semiconductor chips is provided on each of the first conductive layers.

8. The package according to claim 6, further comprising a plurality of second semiconductor chips, each of the second semiconductor chips including a third electrode and a fourth electrode,
each of the first conductive layers being connected to at least one of the third electrodes, the first conductive layers being connected to mutually-different third electrodes,
the second conductive layer being connected to the plurality of fourth electrodes.

9. The package according to claim 8, wherein at least one of the second semiconductor chips is provided on each of the plurality of first conductive layers.

10. The package according to claim 9, wherein a plurality of the second semiconductor chips is provided on each of the first conductive layers.

11. The package according to claim 8, further comprising a plurality of third conductive layers provided on the first surface, the plurality of third conductive layers being separated from the plurality of first conductive layers and the second conductive layer,
each of the second semiconductor chips further including a fifth electrode,
each of the third conductive layers being connected to at least one of the fifth electrodes, the third conductive layers being connected to mutually-different fifth electrodes.

12. The package according to claim 11, wherein
the first semiconductor chips are a diode, and
the second semiconductor chips are an IGBT.

13. The package according to claim 1, wherein
the first terminal includes a first extension unit extending in a first direction perpendicular to the first surface, and
the second extension unit is connected between the first extension unit and each of the first connection unit, the second connection unit, the third connection unit, and the fourth connection unit.

* * * * *